United States Patent
Jeong et al.

(10) Patent No.: US 11,271,549 B2
(45) Date of Patent: Mar. 8, 2022

(54) SEMICONDUCTOR DEVICE FOR CONTROLLING VOLTAGE AT AN INPUT NODE OF A CIRCUIT DURING A LOW POWER MODE

(71) Applicants: SK hynix Inc., Icheon (KR); Seoul National University R&DB Foundation, Seoul (KR)

(72) Inventors: Shin Hyun Jeong, Seoul (KR); Suhwan Kim, Seoul (KR); Gi Moon Hong, Icheon (KR); Ji Hyo Kang, Icheon (KR); Jae Hyeok Yang, Icheon (KR); Dae Han Kwon, Icheon-si (KR); Dong Hyun Kim, Icheon (KR)

(73) Assignees: SK hynix Inc., Icheon (KR); Seoul National University R&DB Foundation, Seoul (KR)

( * ) Notice: Subject to any disclaimer, the term of this patent is extended or adjusted under 35 U.S.C. 154(b) by 0 days.

(21) Appl. No.: 17/097,943

(22) Filed: Nov. 13, 2020

(65) Prior Publication Data

US 2021/0328579 A1   Oct. 21, 2021

(30) Foreign Application Priority Data

Apr. 17, 2020   (KR) .......................... 10-2020-0046666

(51) Int. Cl.
*H03K 3/012* (2006.01)
*H03K 3/037* (2006.01)

(52) U.S. Cl.
CPC ............. *H03K 3/012* (2013.01); *H03K 3/037* (2013.01)

(58) Field of Classification Search
CPC ............................... H03K 3/012; H03K 3/037
See application file for complete search history.

(56) References Cited

U.S. PATENT DOCUMENTS 7,791,389 B2   9/2010   Remington
2008/0195876 A1*   8/2008   Priel .......................... G06F 1/32
                                                          713/320

* cited by examiner

*Primary Examiner* — Sibin Chen

(57) ABSTRACT

A semiconductor device includes a circuit including an input coupled to a first node; and a first signal control circuit configured to determine a voltage of the first node in a low power mode, wherein the first signal control circuit sets a voltage of the first node to a first value in an n-th occurrence of the low power mode and a second value different from the first value in an m-th occurrence of the low power mode, and wherein n and m are two different natural numbers.

19 Claims, 8 Drawing Sheets

<Prior Art>

<Prior Art>

SEMICONDUCTOR DEVICE FOR CONTROLLING VOLTAGE AT AN INPUT NODE OF A CIRCUIT DURING A LOW POWER MODE

CROSS-REFERENCE TO RELATED APPLICATION

The present application claims priority under 35 U.S.C. § 119(a) to Korean Patent Application No. 10-2020-0046666, filed on Apr. 17, 2020, which is incorporated herein by reference in its entirety.

BACKGROUND

1. Technical Field

Various embodiments generally relate to a semiconductor device for controlling voltage at an input node of a circuit, and more specifically, to a semiconductor device for controlling a voltage at an input node of a circuit in a low power mode in which the circuit is idle (that is, does not operate).

2. Related Art

FIG. 1 illustrates a circuit diagram of a conventional semiconductor device.

In FIG. 1, an output circuit 1 includes inverters 11 to 14 and a cross-coupled latch 20.

A power down mode may be a low power mode in which the output circuit 1 does not operate. Here, "does not operate" may mean that even though power may still be supplied to the output circuit 1, the values of signals in and produced by the output circuit 1 do not change.

The inverter 11 inverts the signal of a first node N1 and the inverter 12 inverts a signal of a second node N2.

The inverter 13 provides an output clock signal OCLK by inverting an output of the inverter 11 that is provided to a third node N3.

The inverter 14 provides an inverted output clock signal /OCLK by inverting the output of the inverter 12 that is provided to a fourth node N4.

The cross-coupled latch 20 includes inverters 21 and 22 in which input and output terminals thereof are coupled between the third node N3 and the fourth node N4 in opposite directions to each other.

The output of the NAND gate 31 is provided to the first node N1, and the NAND gate 31 performs a NAND operation on an output of the inverter 33 inverting the clock signal CLK and an inverted low power signal /PD. Accordingly, the first node N1 will have a logic high value when the inverted low power signal /PD has a logic low signal. The inverted low power signal /PD having the logic low value may indicate that the circuit is operating in the low power mode.

The output of the NOR gate 32 is provided to the second node N2, and a NOR gate 32 performs a NOR operation on an output of the inverter 34 inverting an inverted clock signal /CLK and the low power signal PD. Accordingly, the second node N2 will have a logic low value when the low power signal PD has a logic high signal. The low power signal PD having the logic high value may indicate that the circuit is operating in the low power mode.

FIG. 2 illustrates an operation of the conventional semiconductor device of FIG. 1.

FIG. 2 shows a case where the low power signal PD is activated for an n-th occurrence of a low power mode and a case where the low power signal PD is activated for an (n+1)-th occurrence of a low power mode, where n is a natural number.

When the low power signal PD is activated, the output of the NAND gate 31 provided to the first node N1 becomes a high level and the output of the NOR gate 32 provided to the second node N2 becomes a low level.

Accordingly, the third node N3 becomes the low level and the fourth node N4 becomes the high level.

Conventionally, the voltages of the first to fourth nodes N1 to N4 are driven to respective same values in the low power mode regardless of number of times the low power signal PD has been activated. In other words, in the semiconductor device of FIG. 1, whenever the output circuit 1 is in the low power mode, the second and third nodes N2 and N3 are driven to a logic low value and the first and fourth nodes N1 and N4 are driven to a logic high value.

Accordingly, as a result of the low power mode being used, an amount of time that the high level voltage is applied to a gate of the transistor included in the inverter 11 coupled to the first node N1 relative to an amount of time the low level voltage is applied to the gate of the transistor included in the inverter 11 increases, and an amount of time that the low level voltage is applied to the gate of a transistor included in the inverter 12 coupled to the second node N2 increases relative to an amount of time the high level voltage is applied to the gate of the transistor included in the inverter 12. As the differences in the respective applied times increases, a degree of deterioration of the two transistors gradually becomes different, and mismatches of operational characteristics between the transistors may increase.

The same phenomenon also occurs in the inverters 13 and 21 coupled to the input terminal to the third node N3 and the inverters 14 and 22 coupled to the input terminal to the fourth node N4.

Because of the increase in the mismatches between the operational characteristics of the transistors caused by the differences in applied voltages during the low power mode, operational characteristics of the circuit during a normal power mode may also deteriorate, which can cause problems.

SUMMARY

In accordance with an embodiment of the present disclosure, a semiconductor device includes a circuit including an input coupled to a first node, and a first signal control circuit configured to determine a voltage of the first node in a low power mode, wherein the first signal control circuit sets a voltage of the first node to a first value in an n-th occurrence of the low power mode and to a second value different from the first value in an m-th occurrence of the low power mode, and wherein n and m are two different natural numbers.

In accordance with an embodiment of the present disclosure, a semiconductor device includes a circuit including a first input coupled to a first node and a second input coupled to a second node; a first signal control circuit configured to determine a voltage of the first node in a low power mode; and a second signal control circuit configured to determine a voltage of the second node in the low power mode, wherein the first signal control circuit sets a voltage of the first node in an n-th occurrence of the low power mode and a voltage of the first node in an m-th occurrence of the low power mode differently, wherein the second signal control circuit sets a voltage of the second node in an i-th occurrence of the low power mode and a voltage of the second node in a j-th occurrence of the low power mode differently, wherein n and m are two different natural numbers, and i and j are two different natural numbers, and wherein the voltage of the first node is different from the voltage of the second node when in an occurrence of the low power mode.

In accordance with an embodiment of the present disclosure, a method for operating a semiconductor device may include receiving a low power signal indicating a plurality of successive occurrences of a low power mode; when the low power signal does not indicate an occurrence of the low power mode, producing a voltage according to a first input signal on a first node; when the low power signal indicates an n-th occurrence of the low power mode, producing a first voltage value on the first node; and when the low power signal indicates a m-th occurrence of the low power mode, producing a second voltage on the first node, wherein n and m are two different natural numbers, and wherein the first voltage is different from the second voltage.

BRIEF DESCRIPTION OF THE DRAWINGS

The accompanying figures, where like reference numerals refer to identical or functionally similar elements throughout the separate views, together with the detailed description below, are incorporated in and form part of the specification, and serve to further illustrate various embodiments, and explain various principles and advantages of those embodiments.

DETAILED DESCRIPTION

The following detailed description references the accompanying figures in describing illustrative embodiments consistent with this disclosure. The embodiments are provided for illustrative purposes and are not exhaustive. Additional embodiments not explicitly illustrated or described are possible. Further, modifications can be made to presented embodiments within the scope of the present teachings. The detailed description is not meant to limit this disclosure. Rather, the scope of the present disclosure is defined in accordance with claims and equivalents thereof. Also, throughout the specification, reference to "an embodiment" or the like is not necessarily to only one embodiment, and different references to any such phrase are not necessarily to the same embodiment(s).

Figure 1:
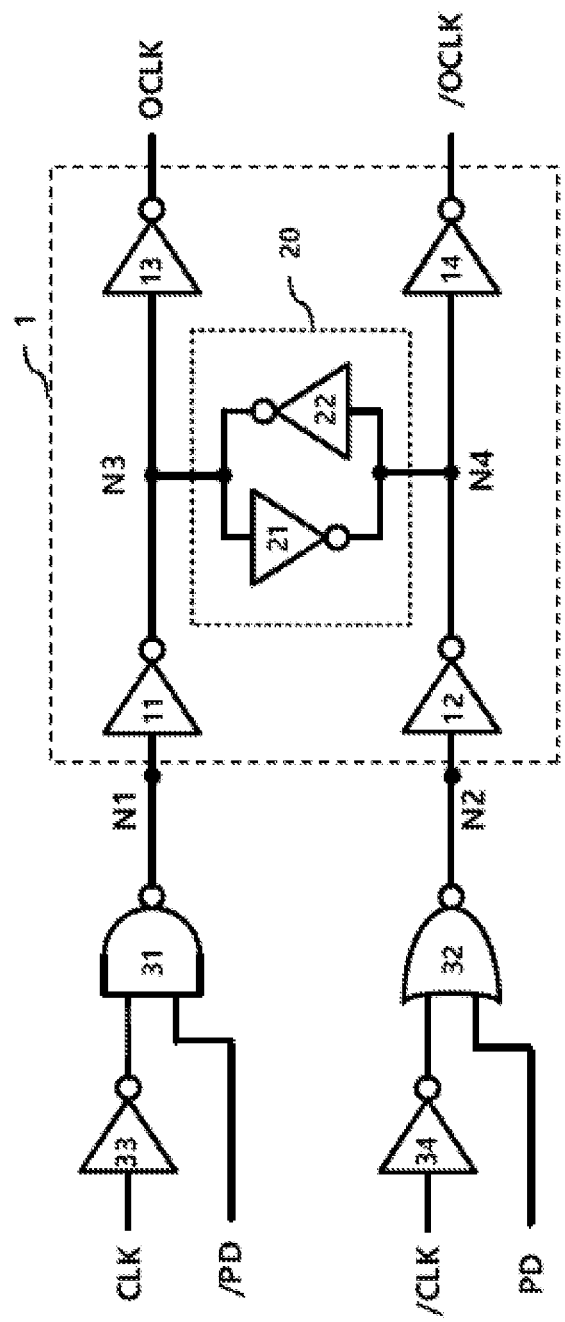
FIG. 1 illustrates a conventional semiconductor device.
Figure 2:
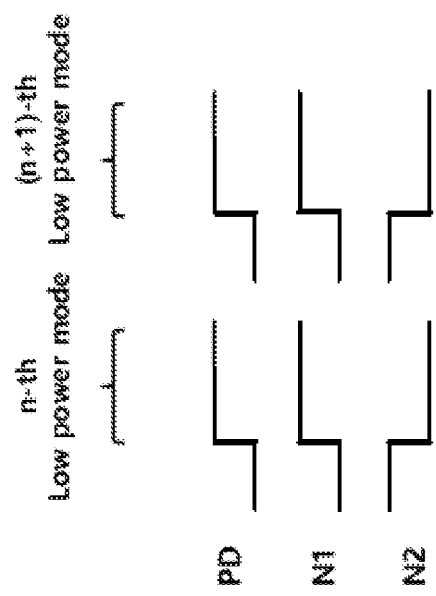
FIG. 2 illustrates an operation of a conventional semiconductor device.
Figure 3:
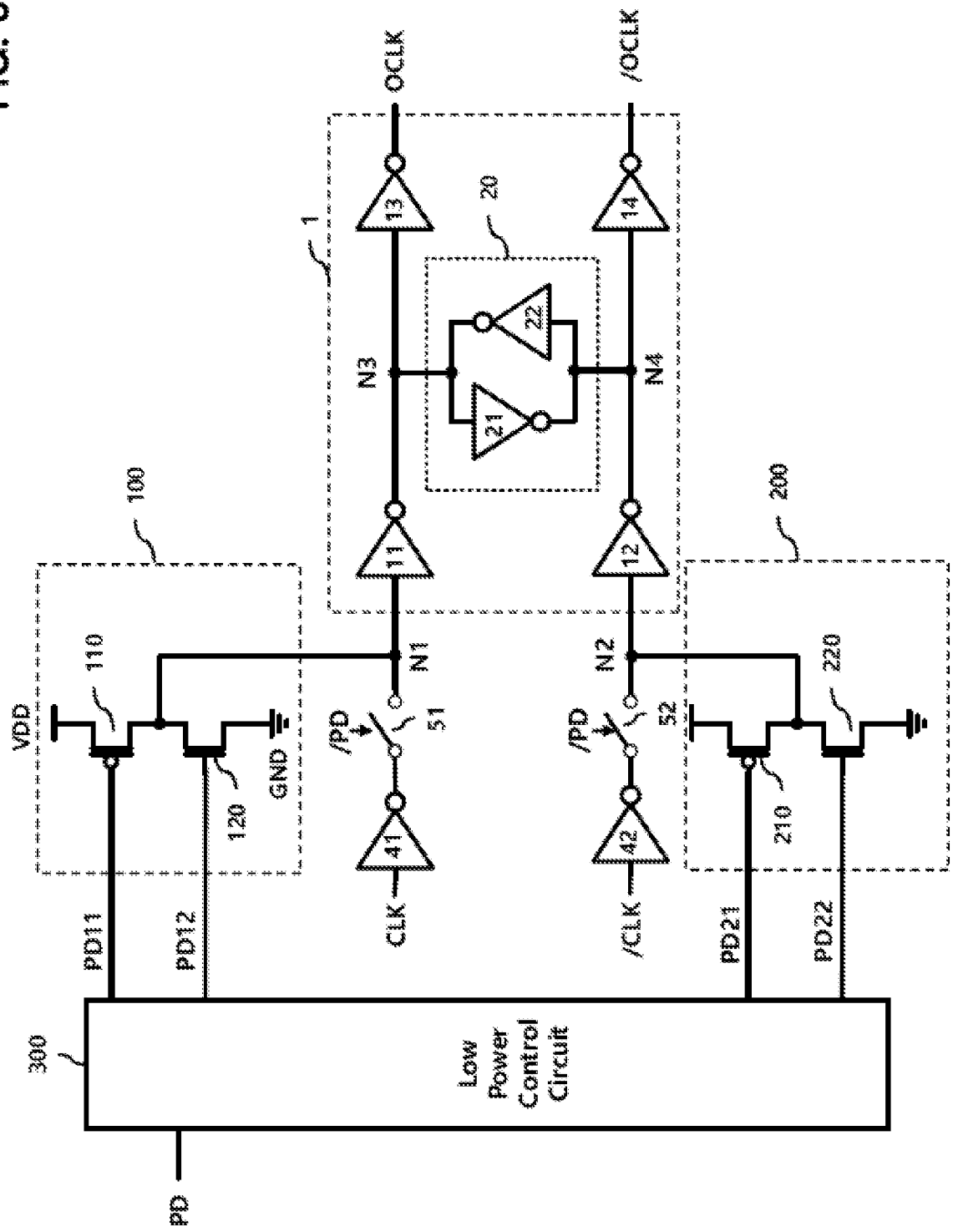
FIG. 3 illustrates a semiconductor device according to an embodiment of the present disclosure.

FIG. 3 illustrates a semiconductor device according to an embodiment of the present disclosure.

In the embodiment, the semiconductor device includes an output circuit 1, a first signal control circuit 100, a second signal control circuit 200, and a low power control circuit 300.

The output circuit 1 buffers respective signals provided to a first node N1 and a second node N2 to generate an output clock signal OCLK and an inverted output clock signal /OCLK.

The output circuit 1 includes inverters 11, 12, 13, and 14 and a cross-coupled latch 20.

The inverter 11 inverts the signal of the first node N1 and the inverter 12 inverts the signal of the second node N2.

The inverter 13 provides the output clock signal OCLK by inverting the output of the inverter 11 that is provided to a third node N3.

The inverter 14 provides the inverted output clock signal /OCLK by inverting the output of the inverter 12 that is provided to a fourth node N4.

The cross-coupled latch 20 includes cross-coupled inverters 21 and 22. An input terminal of inverter 21 and an output terminal of inverter 22 are coupled to the third node N3 and an input terminal of inverter 22 and an output terminal of inverter 21 are coupled to the fourth node N4.

In the present embodiment, the first node N1 and the second node N2 are coupled to the input terminals of the inverters 11 and 12, but the first node N1 and the second node N2 may be coupled to other kinds of circuits such as a buffer.

In addition, although the output circuit 1 is illustrated in this embodiment, a circuit other that the output circuit 1 may be included as long as the circuit includes an input terminal whose voltage may be fixed when the semiconductor device operates in the low power mode.

Hereinafter, the low power mode refers to an operation mode in which the output circuit 1 does not operate; that is, during which the values of the outputs and the internal nodes of the output circuit 1 do not change.

In order to enter the low power mode, that is, to cause the semiconductor device to operate in the low power mode, a predetermined signal for low power operation, such as a power down signal PD, may be used, but embodiments are not limited thereto.

For example, when the output circuit 1 does not operate during a refresh operation, the refresh control signal may be used to enter the low power mode.

This can be similarly applied for other operations in which the output circuit 1 does not operate.

That is, in the present disclosure, the low power signal refers to a signal indicating that the output circuit 1 is to enter or operate in the low power mode, such as the power down signal or the refresh control signal discussed above. Each assertion of the low power signal (such as, for example, each time the low power signal goes high) may indicate entry into another occurrence of the low power mode.

The first signal control circuit 100 controls the level of the signal provided to the first node N1 in the low power mode according to a first pair of low power signals PD11 and PD12.

The first pair of low power signals includes an 11th low power signal PD11 and a 12th low power signal PD12.

When the low power mode is repeatedly entered, the first signal control circuit 100 controls the voltage at the first node N1 to be at a high level during some occurrences of the low power mode and to be at a low level during other occurrences of the low power mode. For successive occurrences of the low power mode, the first signal control circuit 100 may control the voltage at the first node N1 to alternate between the high level and the low level.

When the low power mode is not entered (that is, when the semiconductor device is not operating in the low power mode), the first signal control circuit 100 floats its output that is coupled to the first node N1 so that the voltage at the first node N1 may be controlled by another circuit, such as the inverter 41 as described below.

The second signal control circuit 200 controls the level of the signal provided to the second node N2 in the low power mode according to a second pair of low power signals PD21 and PD22.

The second pair of low power signals includes a 21st low power signal PD21 and a 22nd low power signal PD22.

When the low power mode is repeatedly entered, the second signal control circuit 200 controls the voltage at the second node N2 to be at a high level during some occurrences of the low power mode and to be at a low level during other occurrences of the low power mode. For successive occurrences of the low power mode, the second signal control circuit 200 may control the voltage at the second node N2 to alternate between the high level and the low level.

When the low power mode is not entered, the second signal control circuit 200 floats its output that is coupled to the second node N2 so that the voltage at the second node N2 may be controlled by another circuit, such as the inverter 42 as described below.

In the present embodiment, the first node N1 and the second node N2 are set to have different levels in the low power mode, but they are not necessarily set in this manner.

The low power control circuit 300 generates the first pair of low power signals PD11 and PD12 and the second pair of low power signals PD21 and PD22 according to the low power signal PD.

The first pair of low power signals PD11 and PD12 control the first signal control circuit 100, and the second pair of low power signals PD21 and PD22 control the second signal control circuit 200.

Figure 4:
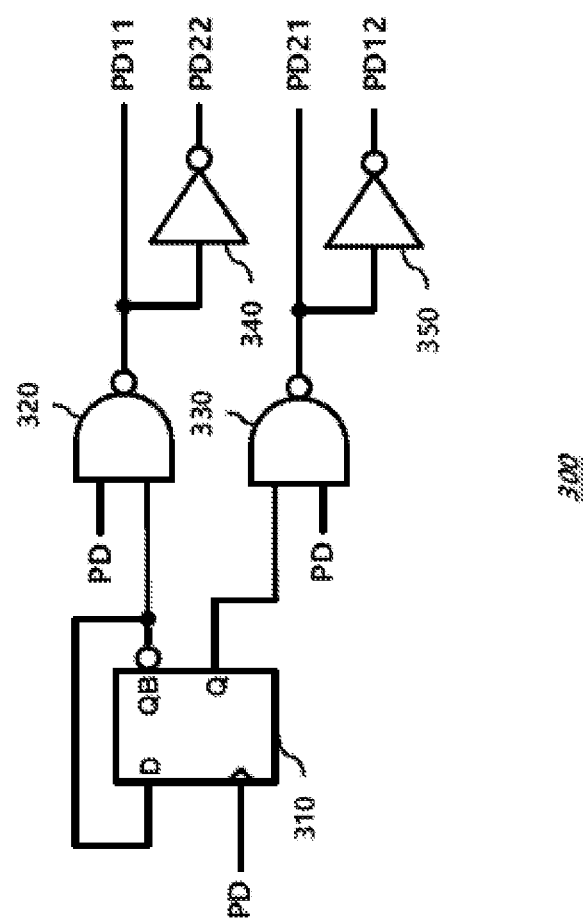
FIG. 4 illustrates a low power control circuit according to an embodiment of the present disclosure.

FIG. 4 illustrates the low power control circuit 300 according to an embodiment.

The low power control circuit 300 includes a flip-flop 310, NAND gates 320 and 330, and inverters 340 and 350.

In this embodiment, the flip-flop 110 is a D flip-flop and operates in synchronization with a rising edge of the low power signal PD.

In addition, an inverted output signal QB of the flip-flop 310 is provided to a data input signal D of the flip-flop 310.

Accordingly, each of an output signal Q and the inverted output signal QB of the flip-flop 310 transitions to an opposite level relative to their respective previous level at each rising edge of the low power signal PD.

The NAND gate 320 provides an 11th low power signal PD11 by performing a NAND operation on the low power signal PD and the inverted output signal QB, so that the 11th low power signal PD11 has a high level when the low power signal PD has a low level indicating that the low power mode is not active, and has a level complimentary to the inverted output signal QB of the flip-flop 310 when the low power signal PD has a high level indicating that the low power mode is active.

The NAND gate 330 provides the 21st low power signal PD21 by performing a NAND operation on the low power signal PD and the output signal Q, so that the 21st low power signal PD21 has a high level when the low power signal PD has a low level indicating that the low power mode is not active, and has a level complimentary to the output signal Q of the flip-flop 310 when the low power signal PD has a high level indicating that the low power mode is active.

The inverter 340 outputs the 22nd low power signal PD22 by inverting the output of the NAND gate 320.

The inverter 350 output the 12th low power signal PD12 by inverting the output of the NAND gate 330.

When the low power mode is not entered, that is, when the low power signal PD is at the low level, the 11th low power signal PD11 and the 21st low power signal PD21 are driven to the high level, and the 12th low power signal PD12 and the 22nd low power signal PD22 are driven to the low level.

When the low power mode is entered, that is, when the low power signal PD transitions to the high level, the output signal Q of the flip-flop 310 has the same level as the inverted output signal QB had in the previous occurrence of the low power mode, and the inverted output signal QB has the same level as the output signal Q had in the previous occurrence of the low power mode.

Accordingly, the 11th low power signal PD11 has the same level as the 21st low power signal PD21 in the previous occurrence of the low power mode, and the 12th low power signal PD12 has the same level as the 22nd low power signal PD22 in the previous occurrence of the low power mode.

In addition, the 21st low power signal PD21 has the same level as the 11th low power signal PD11 had in the previous occurrence of the low power mode, and the 22nd low power signal PD22 has the same level as the 12th low power signal PD12 had in the previous occurrence of the low power mode.

Returning to FIG. 3, the first signal control circuit 100 includes a first PMOS transistor 110 having a source coupled to the power voltage VDD and a first NMOS transistor 120 having a source coupled to the ground voltage GND, and respective drains of the first PMOS transistor 110 and the first NMOS transistor 120 are coupled in common.

The 11th low power signal PD11 is applied to the gate of the first PMOS transistor 110 and the 12th low power signal PD12 is applied to the gate of the first NMOS transistor 120.

In the low power mode, only one of the first PMOS transistor 110 and the first NMOS transistor 120 is turned on to respectively drive the first node N1 to the power voltage VDD or the ground voltage GND.

Whenever the low power mode is repeated, the first PMOS transistor 110 or the first NMOS transistor 120 is alternately turned on. Accordingly, for any number 2·X of consecutive occurrences of the lower power mode, where X is a natural number, the first node N1 will be driven to the power voltage VDD during X occurrences of the lower power mode, and will be driven to the ground voltage GND during the other X occurrences of the lower power mode.

When the low power mode is not entered, the 11th low power signal PD11 has the high level and the 12th low power signal PD12 has the low level, and as a result both the first PMOS transistor 110 and the first NMOS transistor 120 are turned off. Thus, when not in the low power mode, the first signal control circuit 100 is separated from the first node N1; that is, the first signal control circuit 100 presents a high impedance to the first node N1, and does not drive (i.e. sink current from or source current to) the first node N1.

The second signal control circuit 200 includes a second PMOS transistor 210 having a source coupled to the power voltage VDD and a second NMOS transistor 220 having a source coupled to the ground voltage GND, and respective drains of the second PMOS transistor 210 and the second NMOS transistor 220 are coupled in common.

The 21st low power signal PD21 is applied to the gate of the second PMOS transistor 210 and the 22nd low power signal PD22 is applied to the gate of the second NMOS transistor 220.

In the low power mode, only one of the second PMOS transistor 210 and the second NMOS transistor 220 is turned on to respectively drive the second node N2 to the power voltage VDD or the ground voltage GND.

Whenever the low power mode is repeated, the second PMOS transistor 210 or the second NMOS transistor 220 is alternately turned on.

Accordingly, for any number 2·X of consecutive occurrences of the lower power mode, where X is a natural number, the second node N2 will be driven to the power voltage VDD during X occurrences of the lower power mode, and will be driven to the ground voltage GND during the other X occurrences of the lower power mode.

When the low power mode is not entered, the 21st low power signal PD21 has the high level and the 22nd low power signal PD22 has the low level, and as a result both the second PMOS transistor 210 and the second NMOS transistor 220 are turned off. Thus, when not in the low power mode, the second signal control circuit 200 is separated from the second node N2; that is, the second signal control circuit 200 presents a high impedance to the second node N2, and does not drive (i.e. sink current from or source current to) the second node N2.

In this embodiment, the semiconductor device further includes a first switch 51 and a second switch 52 that are turned on when the low power mode is not entered.

When the first switch 51 is turned on, the clock signal CLK determines the value applied to the first node N1, and when the second switch 52 is turned on, the inverted clock signal /CLK determines the value applied to the second node N2.

In this embodiment, the inverters 41 and 42 may be further included. The inverter 41 may invert the clock signal CLK and provide an output signal thereof to the first switch 51, and the inverter 42 may invert the inverted clock signal /CLK provided an output signal thereof to the second switch 52.

Hereinafter, a signal applied to the first node N1 from a source other than the first signal control circuit 100 (for example, in FIG. 3, the output of inverter 41) may be referred to as a first input signal.

Also, a signal applied to the second node N2 from a source other than the second signal control circuit 200 (for example, in FIG. 3, the output of inverter 42) may be referred to as a second input signal.

Figure 5:
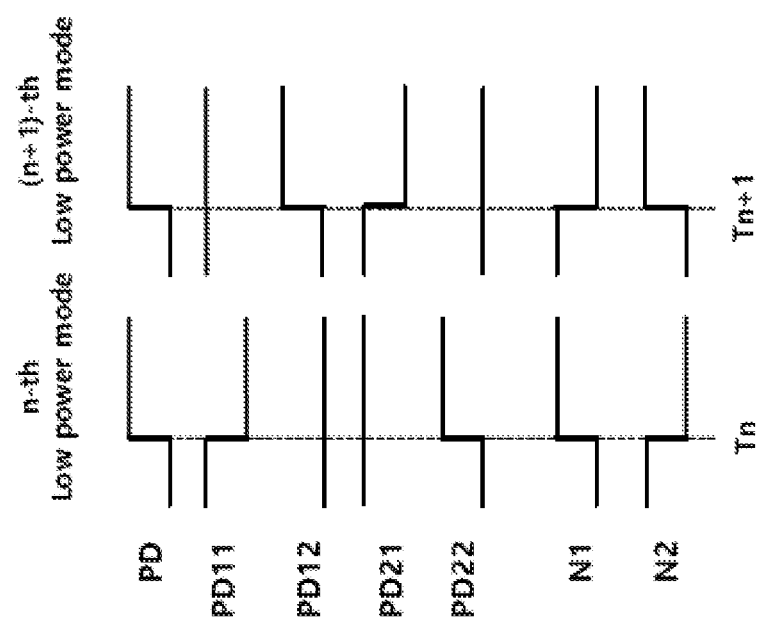
FIG. 5 illustrates an operation of a semiconductor device according to an embodiment of the present disclosure.

FIG. 5 illustrates an operation of a semiconductor device according to an embodiment of the present disclosure.

As described above, when the low power mode is not entered, that is, when the low power signal PD is at the low level, both the 11th low power signal PD11 and the 21st low power signal PD21 have the high level, and both the 12th low power signal PD12 and the 22nd low power signal PD22 have the low level.

Accordingly, when the low power mode is not entered, the first signal control circuit 100 does not drive the first node N1, the second signal control circuit 200 does not drive the second node N2, and voltages of the first node N1 and the second node N2 are determined according to outputs of the inverters 41 and 42.

In the illustrated timing diagram, the n-th occurrence of the low power mode is entered at Tn, and the (n+1)-th occurrence of the low power mode is entered at Tn+1.

When the low power mode is entered for the (n+1)-th time at Tn+1, the 11th low power signal PD11 has the same level as the 21st low power signal PD21 had when the low power mode was entered for the n-th time at Tn, and the 12th low power signal PD12 has the same level as the 22nd low power signal PD22 had when the low power mode was entered for the n-th time at Tn.

In addition, when the low power mode is entered for the (n+1)-th time at Tn+1, the 12th low power signal PD12 has the same level as the 22nd low power signal PD22 had when the low power mode was entered for the n-th time at Tn, and the 22nd low power signal PD22 has the same level as the 12th low power signal PD12 had when the low power mode was entered for the n-th time at Tn.

In addition, in each occurrence of the low power mode, the 11th low power signal PD11 and the 22nd low power signal PD22 have opposite levels, and the 12th low power signal PD12 and the 21st low power signal PD21 have opposite levels.

Accordingly, when the low power mode is entered for the (n+1)-th time at Tn+1, the 11th low power signal PD11 is driven to the high level and the 22nd low power signal PD22 is driven to the low level.

Accordingly, in the n-th occurrence of the low power mode, the 11th low power signal PD11 and the 12th low power signal PD12 have the same level, and the 21st low power signal PD21 and the 22nd low power signal PD22 have the same level, and the 11th low power signal PD11 and the 21st low power signal PD21 have opposite levels.

In FIG. 5, in the n-th occurrence of the low power mode, both the 11th low power signal PD11 and the 12th low power signal PD12 are at the low level, the 21st low power signal PD21 and the 22nd low power signal PD22 are both at the high levels, and in the (n+1)-th occurrence of the low power mode, both the 11th low power signal PD11 and the 12th low power signal PD12 are changed to the high level, and both the 21st low power signal PD21 and the 22nd low power signal PD22 are changed to the low level.

Accordingly, in the n-th occurrence of the low power mode, the first PMOS transistor 110 is turned on to drive the voltage of the first node N1 to the high level, and in the (n+1)-th occurrence of the low power mode, the first NMOS transistor 120 is turned on to drive the voltage of the first node N1 to the low level.

In addition, in the n-th occurrence of the low power mode, the second NMOS transistor 220 is turned to drive the voltage of the second node N2 to the low level, and in the (n+1)-th occurrence of the low power mode, the second PMOS transistor 210 is turned on to drive the voltage of the second node N2 to the high level.

As described above, each time the low power mode is entered, the voltages of the first node N1 and the second node N2 are alternately applied in opposite directions, and as a result problems caused by uneven deterioration of the transistors included in the inverters 11 and 12 may be reduced or eliminated.

Figure 6:
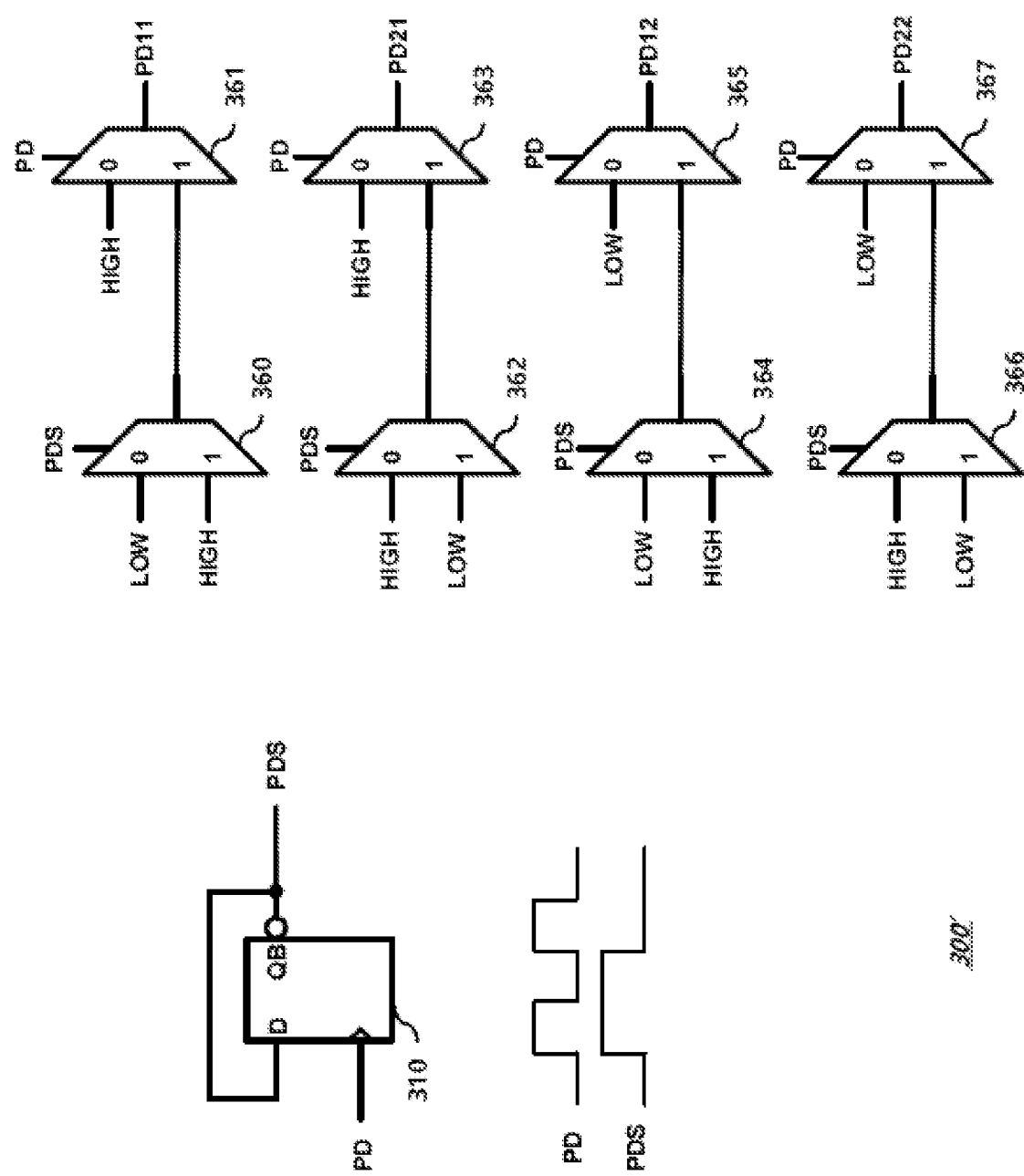
FIG. 6 illustrates a low power control circuit according to another embodiment of the present disclosure.

FIG. 6 illustrates a low power control circuit 300' according to another embodiment of the present disclosure.

The low power control circuit 300' includes a flip-flop 310.

Since the flip-flop 310 operates in the same manner as that shown in FIG. 3, a repeated description will be omitted.

The inverted output signal QB of the flip-flop 310 is used as a low power selection signal PDS.

The low power selection signal PDS has a waveform in which the level is reversed at a rising edge of the low power signal PD.

In this embodiment, the low power control circuit 300' includes a plurality of selection circuits 360 to 367.

The plurality of selection circuits 360 to 367 are controlled according to the low power selection signal PDS and the low power signal PD to produce the 11th low power signal PD11, the 12th low power signal PD12, the 21st low power signal PD21, and the 22nd low power signal PD22.

The logic levels of the 11th, 12th, 21st, and 22nd low power signals PD11, PD12, PD21, and PD22 generated by the low power control circuit 300' are the same as those shown in FIG. 5.

The selection circuit 360 outputs a low level signal when the low power selection signal PDS is at the low level, and outputs a high level signal when the low power selection signal PDS is at the high level.

The selection circuit 361 sets the 11th low power signal PD11 to the high level when the low power signal PD is at the low level, that is, when the low power mode is not entered, and when the low power signal PD is at the high level, that is, when the low power mode is entered, the 11th low power signal PD11 is set as the output of the selection circuit 360.

The selection circuits 362 to 367 operate similarly to the above to generate the 21st low power signal PD21, the 12th low power signal PD12, and the 22nd low power signal PD22 as shown in FIG. 5.

Figure 7:
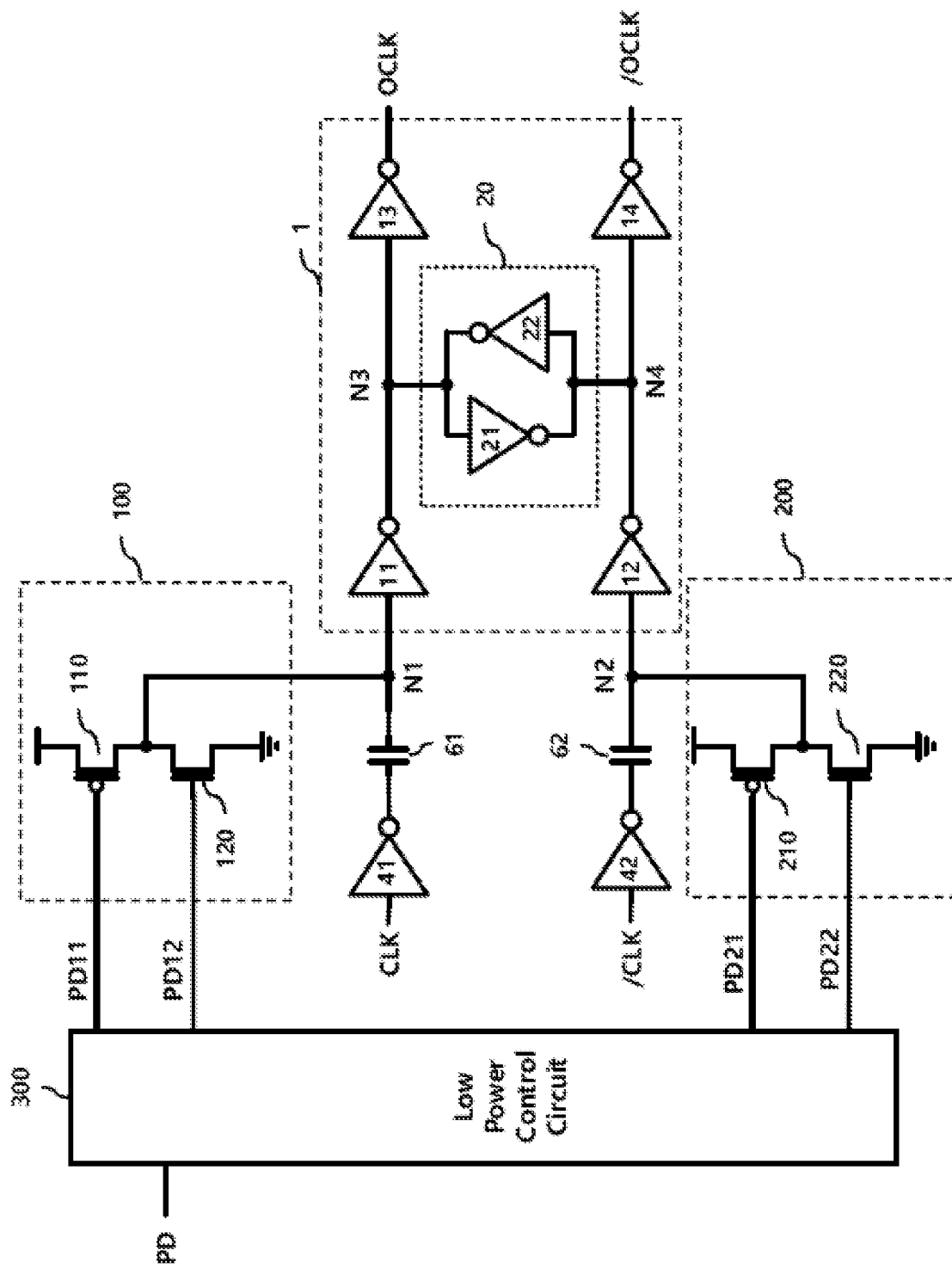
FIGS. 7 and 8 respectively illustrate semiconductor devices according to other embodiments of the present disclosure.
Figure 8:
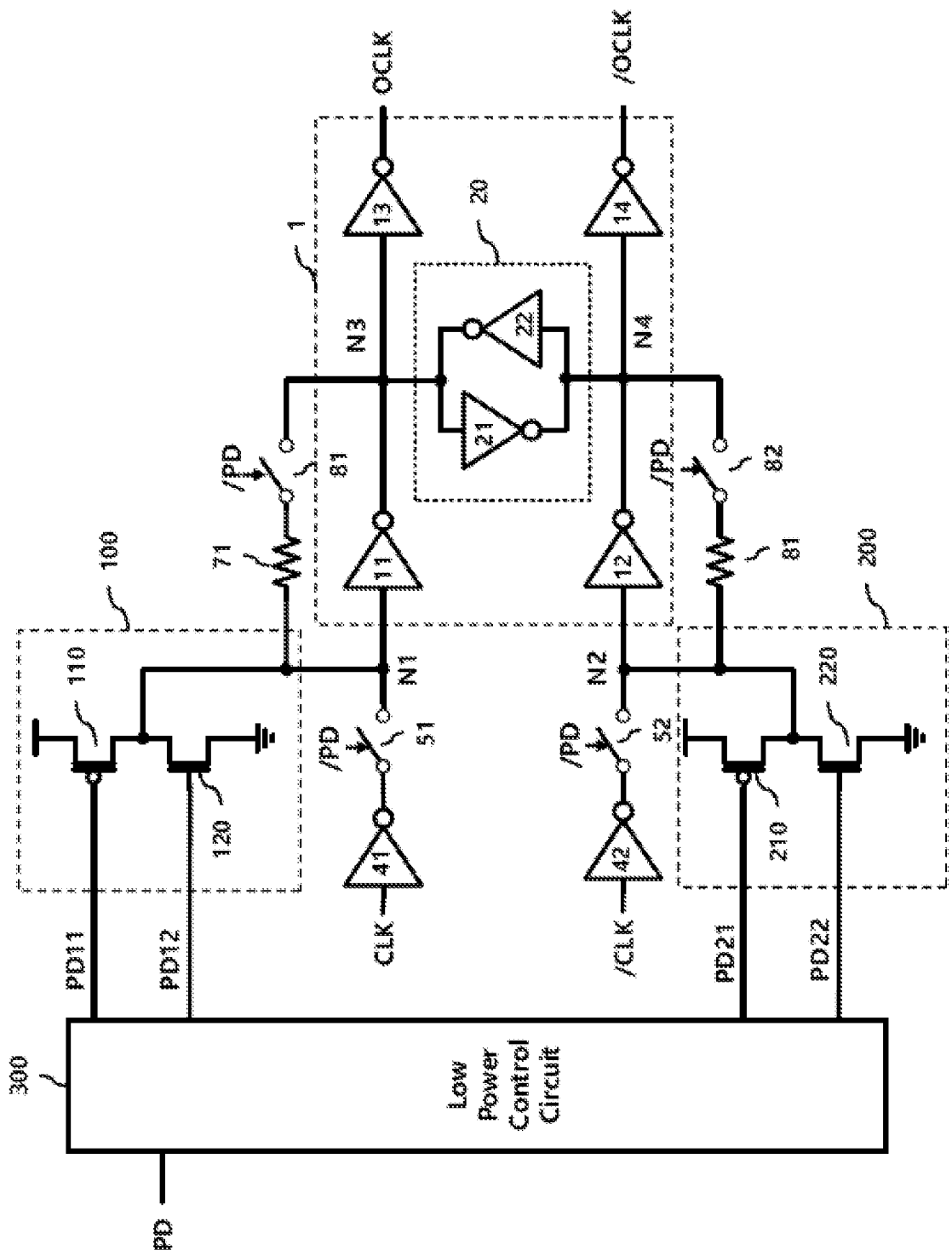

FIGS. 7 and 8 respectively illustrate circuit diagrams showing semiconductor devices according to other embodiments of the present disclosure.

The embodiment of FIG. 7 differs from the embodiment of FIG. 3 in that it includes a first capacitor 61 and a second capacitor 62 instead of the first switch 51 and the second switch 52, and other elements are substantially the same as those in FIG. 3.

When the low power mode is not entered, the output signals of the inverters 41 and 42 are applied to the first node N1 and the second node N2 through the first capacitor 61 and the second capacitor 62, respectively. But in the low power mode, voltages of the first node N1 and the second node N2 are respectively controlled by the first signal control circuit 100 and the second signal control circuit 200 in the manner described with respect to the embodiment shown in FIG. 3.

Further details of the operation of the embodiment of FIG. 7 are not described since they are substantially the same as those in the embodiment of FIG. 3.

The embodiment of FIG. 8 differs from the embodiment of FIG. 3 in that it further includes a first resistor 71 and a third switch 81 coupled in series between the first node N1 and the third node N3, and includes a second resistor 72 and a fourth switch 82 coupled in series between the second node N2 and the fourth node N4.

The third switch 81 and the fourth switch 82 are turned off in the low power mode.

Accordingly, when the low power mode is not entered, the first resistor 71 operates as a feedback resistor of the inverter 11 and the second resistor 72 operates as a feedback resistor of the inverter 12.

There is an advantage that the inverters 11 and 12 are less affected by process-voltage-temperature (PVT) variation through the operation of the feedback resistors 71 and 81.

Further details of the operation of the embodiment of FIG. 8 are not described since they are substantially the same as those in the embodiment of FIG. 3.

In the above, illustrative embodiments in which signals applied to the first node N1 and the second node N2 are changed whenever the low power mode is entered are described. However, the techniques used to change the signals applied to the first node N1 and the second node N2 are not limited to the illustrated embodiments and can be variously changed.

In addition, although the present embodiment has been disclosed using a differential circuit as an example, the present invention can be applied to a circuit having a single input node.

Although various embodiments have been illustrated and described, various changes and modifications may be made to the described embodiments without departing from the spirit and scope of the invention as defined by the following claims.

What is claimed is:

1. A semiconductor device comprising:
   a circuit including an input coupled to a first node; and
   a first signal control circuit configured to determine a voltage of the first node in a low power mode,
   wherein the first signal control circuit sets a voltage of the first node to a first value in an n-th occurrence of the low power mode and to a second value different from the first value in an m-th occurrence of the low lower power mode, and
   wherein n and m are two different natural numbers.

2. The semiconductor device of claim 1, further comprising a low power control circuit configured to control the first signal control circuit according to a low power signal indicating the low power mode.

3. The semiconductor device of claim 2, wherein the low power control circuit controls the first signal control circuit so that the first node is not driven from the first signal control circuit when the low power mode is not entered.

4. The semiconductor device of claim 2, wherein the first signal control circuit comprises:
   a first PMOS transistor including a gate receiving an 11th low power signal from the low power control circuit, a source coupled to a power source voltage, and a drain coupled to the first node; and
   a first NMOS transistor including a gate receiving a 12th low power signal from the low power control circuit, a source coupled to a ground voltage, and a drain coupled to the first node.

5. The semiconductor device of claim 2, wherein the low power signal is a power down signal or a refresh control signal.

6. The semiconductor device of claim 1, further comprising a switch providing an input signal to the first node.

7. The semiconductor device of claim 1, further comprising a capacitor providing an input signal to the first node.

8. The semiconductor device of claim 1, wherein the circuit includes an inverter having an input coupled to the first node.

9. The semiconductor device of claim 8, further comprising a resistor coupled between an input terminal and an output terminal of the inverter when the low power mode is not entered.

10. A semiconductor device comprising:
    a circuit including a first input coupled to a first node and a second input coupled to a second node;
    a first signal control circuit configured to determine a voltage of the first node in a low power mode; and
    a second signal control circuit configured to determine a voltage of the second node in the low power mode,
    wherein the first signal control circuit sets a voltage of the first node in an n-th occurrence of the low power mode and a voltage of the first node in an m-th occurrence of the low power mode differently,
    wherein the second signal control circuit sets a voltage of the second node in an i-th occurrence of the low power mode and a voltage of the second node in a j-th occurrence of the low power mode differently, wherein n and m are two different natural numbers, and i and j are two different natural numbers, and wherein the voltage of the first node is different from the voltage of the second node when in an occurrence of the low power mode.

11. The semiconductor device of claim 10, further comprising a low power control circuit configured to control the first signal control circuit and the second signal control circuit according to a low power signal indicating the low power mode.

12. The semiconductor device of claim 11, wherein the low power control circuit controls so that the first node is separated from the first signal control circuit and so that the second node is separated from the second signal control circuit when the low power mode is not entered.

13. The semiconductor device of claim 12, wherein the first signal control circuit comprises:
 a first PMOS transistor including a gate receiving a 11th low power signal from the low power control circuit, a source coupled to a power source voltage, and a drain coupled to the first node; and
 a first NMOS transistor including a gate receiving a 12th low power signal from the low power control circuit, a source coupled to a ground voltage, and a drain coupled to the first node, and
 wherein the second signal control circuit comprises:
  a second PMOS transistor including a gate receiving a 21st low power signal from the low power control circuit, a source coupled to a power source voltage, and a drain coupled to the second node; and
  a second NMOS transistor including a gate receiving a 22nd low power signal from the low power control circuit, a source coupled to a ground voltage, and a drain coupled to the second node.

14. The semiconductor device of claim 11, wherein the low power signal is a power down signal or a refresh control signal.

15. The semiconductor device of claim 10, wherein the circuit includes a first inverter coupled between the first node and a third node, and a second inverter coupled between the second node and a fourth node.

16. The semiconductor device of claim 15, wherein the circuit further includes a cross-coupled latch coupled between the third node and the fourth node.

17. A method for operating a semiconductor device, comprising:
 receiving a low power signal indicating a plurality of successive occurrences of a low power mode,
 when the low power signal does not indicate an occurrence of the low power mode, producing a voltage according to a first input signal on a first node;
 when the low power signal indicates an n-th occurrence of the low power mode, producing a first voltage value on the first node; and
 when the low power signal indicates a m-th occurrence of the low power mode, producing a second voltage on the first node,
 wherein n and m are two different natural numbers, and
 wherein the first voltage is different from the second voltage.

18. The method of claim 17, comprising:
 when the low power signal does not indicate an occurrence of the low power mode, producing a voltage according to a second input signal on a second node;
 when the low power signal indicates the n-th occurrence of the low power mode, producing the second voltage value on the second node; and
 when the low power signal indicates a m-th occurrence of the low power mode, producing the first voltage on the second node.

19. The method of claim 17,
wherein the first voltage indicates a logic high value, and
wherein the second voltage indicates a logic low value.

* * * * *